(12) United States Patent
Lee

(10) Patent No.: US 6,756,260 B2
(45) Date of Patent: *Jun. 29, 2004

(54) METHOD FOR MANUFACTURING SEMICONDUCTOR DEVICE USING SEED CONDUCTIVE LAYERS

(75) Inventor: Jong Min Lee, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 10/310,477

(22) Filed: Dec. 5, 2002

(65) Prior Publication Data

US 2003/0119250 A1 Jun. 26, 2003

(30) Foreign Application Priority Data

Dec. 26, 2001 (JP) .......................................... 2001-84884

(51) Int. Cl.⁷ .......................................... H01L 21/8234
(52) U.S. Cl. ....................... 438/238; 438/396; 438/253

(58) Field of Search .................................. 438/253–256, 438/396–399, 652–653, 657, 675

(56) References Cited

U.S. PATENT DOCUMENTS

| | | | |
|---|---|---|---|
| 6,383,865 B2 | 5/2002 | Hong et al. | |
| 6,444,479 B1 | 9/2002 | Choi | |
| 6,461,913 B2 * | 10/2002 | Hong | 438/253 |
| 2002/0013027 A1 * | 1/2002 | Hong et al. | 438/253 |

* cited by examiner

Primary Examiner—Thanh Nguyen
(74) Attorney, Agent, or Firm—Marshall, Gerstein & Borun LLP

(57) ABSTRACT

A method for manufacturing a semiconductor device, and more particularly, to method for manufacturing a semiconductor device is disclosed which comprises a capacitor having a stable platinum (Pt) lower electrode formed using electrochemical deposition (ECD) process wherein an aluminum oxide ($Al_2O_3$) layer is formed on the seed conductive layer as an etching barrier film to prevent the seed conductive layer from being damaged during an etching process for patterning a dummy oxide layer.

19 Claims, 8 Drawing Sheets

METHOD FOR MANUFACTURING SEMICONDUCTOR DEVICE USING SEED CONDUCTIVE LAYERS

BACKGROUND

1. Technical Field

Methods for manufacturing semiconductor devices, and more particularly, methods for manufacturing semiconductor devices are disclosed which comprise a capacitor having a stable platinum (Pt) lower electrode formed using electrochemical deposition (ECD) process wherein an aluminum oxide ($Al_2O_3$) layer is formed on the seed conductive layer as an etching barrier film to prevent the seed conductive layer from being damaged during an etching process for patterning a dummy oxide layer.

2. Description of the Related Art

Generally, a method for increasing an area of a pole plate or a method of using a high dielectric constant material are used to increase capacitance of a capacitor.

When high dielectric constant materials are used, Pt is used as a pole material. FIGS. 1a through 1e are cross-sectional diagrams illustrating sequential steps of a conventional method for manufacturing a DRAM capacitor using Pt.

Referring to FIG. 1a, an interlayer insulating film 13 and a nitride film 14 are sequentially formed on a semiconductor substrate 11, and etched according to a photo-etching process using a lower electrode contact mask to form a storage electrode contact hole (not shown) exposing a predetermined region of the semiconductor substrate 11.

Thereafter, a polysilicon layer 15 is formed to fill the storage electrode contact hole and then over-etched to partially remove the top portion of the contact hole.

A titanium (Ti) layer (not shown) is formed over the resultant structure and thermally treated to form a titanium silicide ($TiSi_2$) layer 17.

The residual Ti layer is removed from the top portion of the interlayer insulating film 13 and then a titanium nitride (TiN) layer 19 is formed over the resultant structure and etched to form a contact plug 20 having a stacked structure. A seed Pt layer 21 is then formed over the resultant structure.

Referring to FIG. 1b, a TiN layer (not shown) which is a diffusion barrier film and a dummy oxide layer (not shown) which is an insulating layer are sequentially formed on the seed Pt layer 21.

The TiN layer and the dummy oxide layer are etched according to a photomask process and a dry etching process to form a sacrificial film pattern 29 which is a stacked structure of a TiN layer pattern 25 and a dummy oxide layer pattern 27 having an opening 30.

Referring to FIG. 1c, a lower electrode 31 is formed with a Pt layer filling the opening 30 using ECD process.

Referring to FIG. 1d, the dummy oxide layer pattern 27 and the TiN layer pattern 25 are removed to expose the seed Pt layer 21.

Referring to FIG. 1e, the exposed portion of the seed Pt layer 21 is removed, and a dielectric film 33 is formed on the entire surface of the resulting structure using chemical vapor deposition (CVD) process.

In order to improve crystallization of the dielectric film, a rapid thermal process (RTP) is performed over the resultant structure, and a Pt layer is deposited on the dielectric film 33 using CVD method to form an upper electrode 35.

However, in the conventional method for manufacturing the capacitor, when the dummy oxide layer pattern is removed to form the lower electrode, the TiN layer is affected by an etching gas due to a low 20:1 etching selectivity ratio of the TiN layer which is the diffusion barrier film and the dummy oxide layer, resulting in the damage of the seed Pt layer 21 in the portion where the sacrificial film pattern is formed. The resulting damage is shown as reference numeral 28 in FIG. 2.

As a result, it is difficult to perform a subsequent process for forming the lower electrode with the Pt layer using ECD process and the yield and reliability of the semiconductor device are adversely affected.

SUMMARY OF THE DISCLOSURE

Improved methods for manufacturing semiconductor devices are disclosed wherein a stable lower electrode is obtained using a process for forming a Pt layer via the ECD process by forming an adhesive layer as an etching barrier film having a high etching selectivity ratio to the dummy oxide layer on the seed Pt layer to prevent the seed Pt layer from being damaged during a patterning process of a dummy oxide layer.

One disclosed method comprises:

forming an interlayer insulating film having a contact hole on a semiconductor substrate;

forming a contact plug filling the contact hole;

forming a seed conductive layer over the resultant structure;

forming an adhesive layer on the seed conductive layer;

forming a dummy oxide layer on the adhesive layer;

sequentially etching the dummy oxide layer and the adhesive layer to a sacrificial film pattern having an opening which exposes a portion of the seed conductive layer on the contact plug;

forming a lower electrode filling the opening using electrochemical deposition process;

sequentially removing the sacrificial film pattern and the seed conductive layer using the lower electrode as a mask; and sequentially forming a dielectric film and an upper electrode on the entire lower electrode.

The adhesive layer can obtain adhesion between the conductive layer and the dummy oxide layer.

It is preferable that the adhesive layer comprises an $Al_2O_3$ layer having a thickness of 50 to 500 Å using CVD process, reactive sputtering process or atomic layer deposition process.

In addition, the dummy oxide layer is removed using the dry etching process. Since the adhesive layer and the dummy oxide layer have an etching selectivity ratio of (adhesive layer: dummy oxide layer) about 50:1, it is used as an etch barrier film during the dummy oxide layer etching process for the lower electrode, thereby increasing an etching process window of the dummy oxide layer. Accordingly, the adhesive layer can achieve stability of the succeeding process for forming the lower electrode according to the ECD process using a Pt layer.

The adhesive layer is removed using the wet etching process. Here, the step of etching adhesive layer is performed in a solution having a HF to water ratio ranging from about 1:1 to about 1:1000 (wt %), preferably, about 1:1 to about 1:500 (wt %), or solution having HF to $NH_4F$ ratio ranging from about 1:7 to about 1:500 (wt %), preferably about 1:7 to about 1:200 (wt %).

The adhesive layer has a high wet etching rate over 10 Å/sec in diluted HF solution. Therefore, when removal of the dummy oxide layer is finished, a residual insulating layer can be removed within 10 seconds from a part where a storage node of the Pt layer is formed using a ECD process.

DETAILED DESCRIPTION OF THE PRESENTLY PREFERRED EMBODIMENTS

Figure 1A:
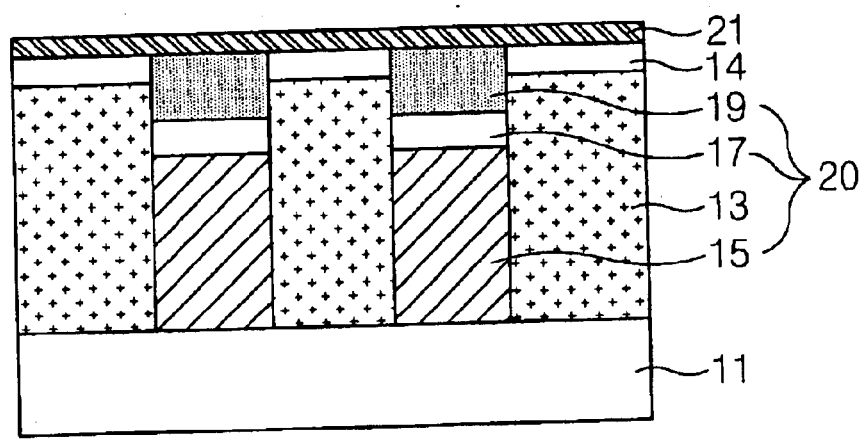
FIGS. 1a through 1e are cross-sectional diagrams illustrating method for manufacturing a semiconductor device in accordance with the conventional art.
Figure 1B:
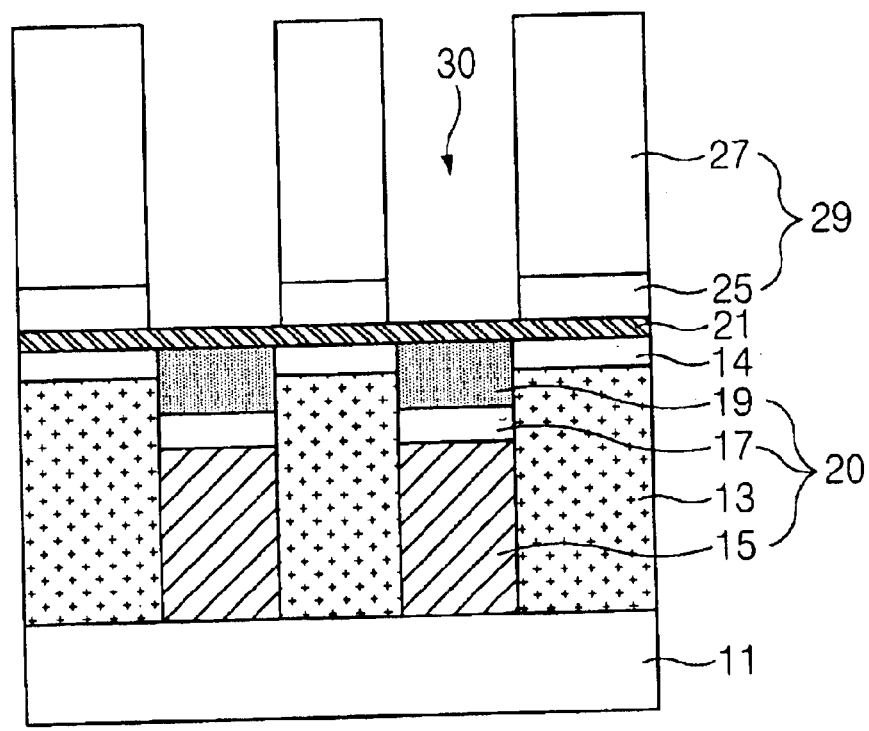
Figure 1C:
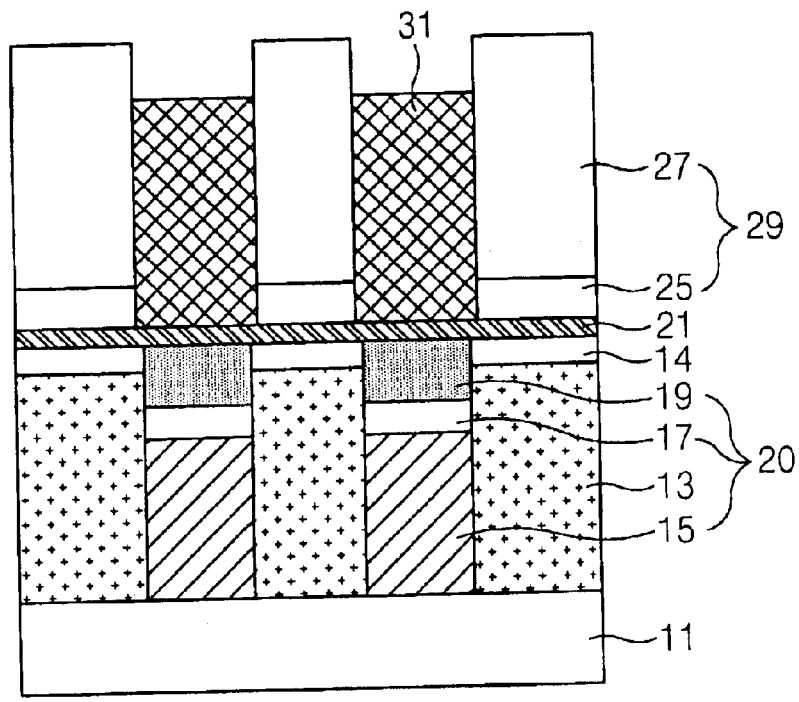
Figure 1D:
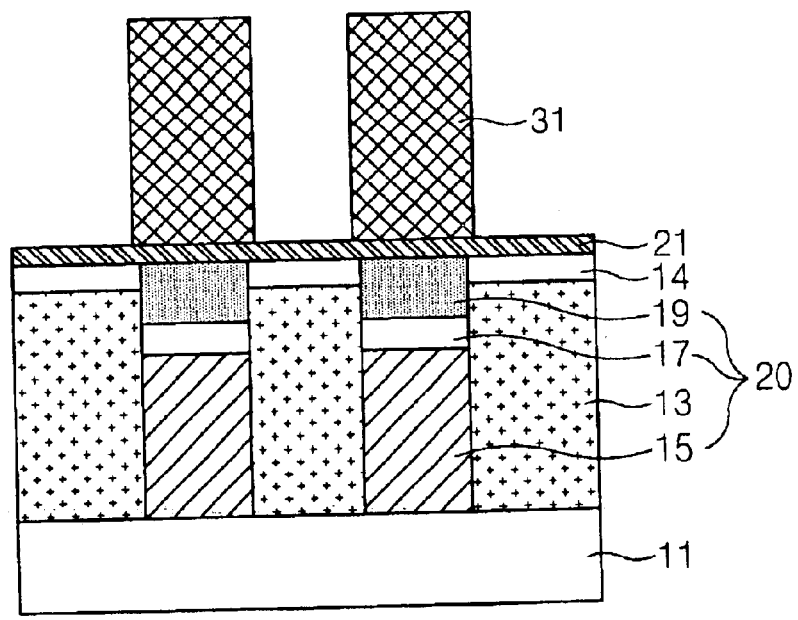
Figure 1E:
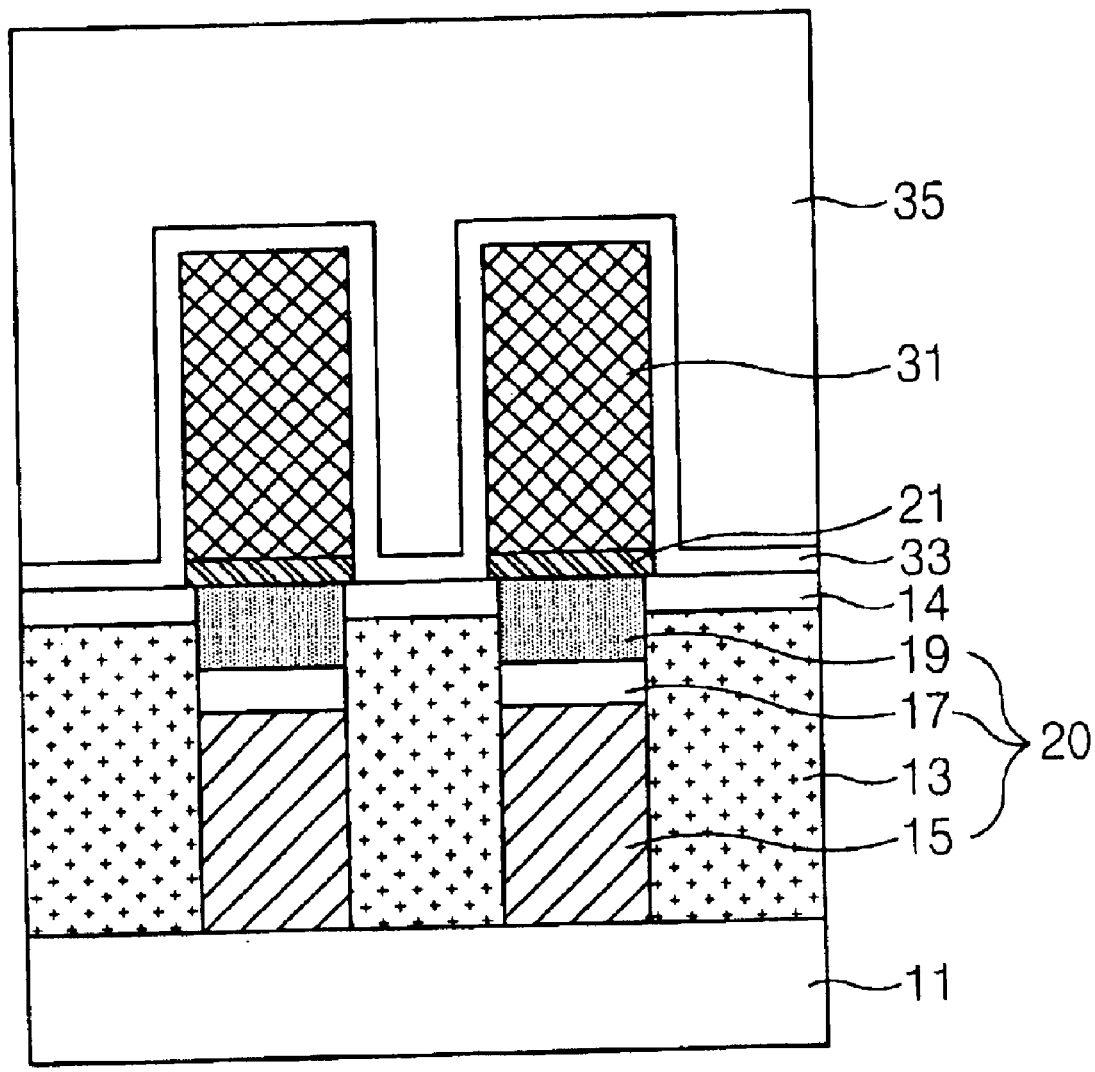
Figure 2:
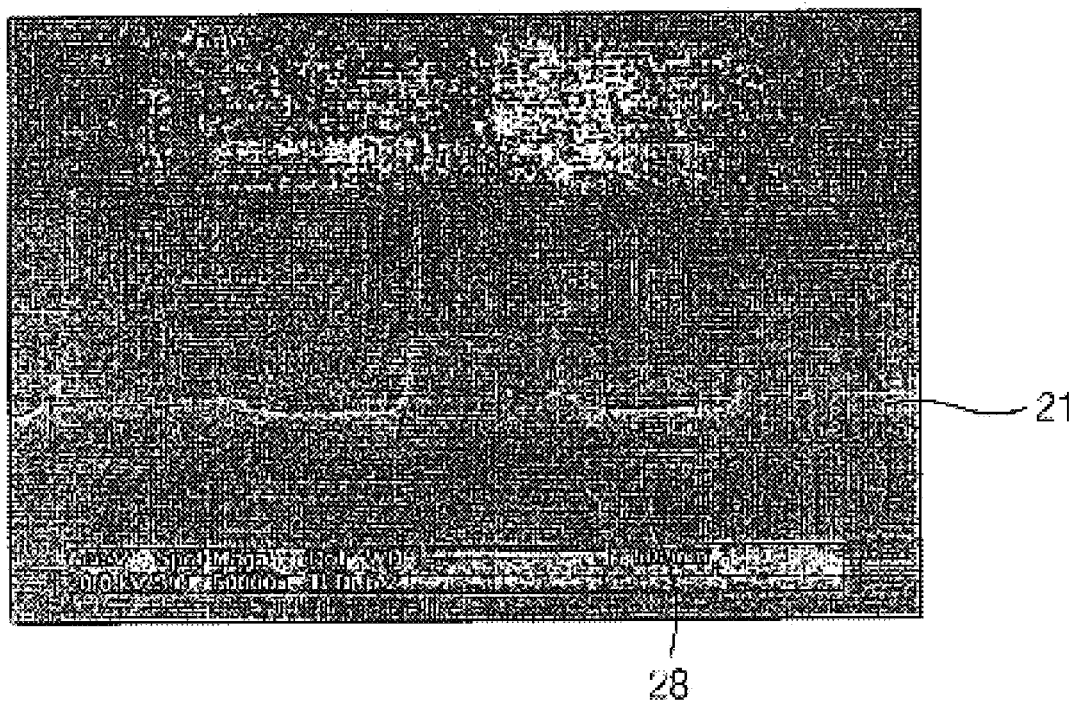
FIG. 2 is a photograph showing a damaged seed conductive layer after a patterning process of a sacrificial film in accordance with the conventional art.

A method for manufacturing a semiconductor device will be described in greater detail while referring to the drawings.

Figure 3A:
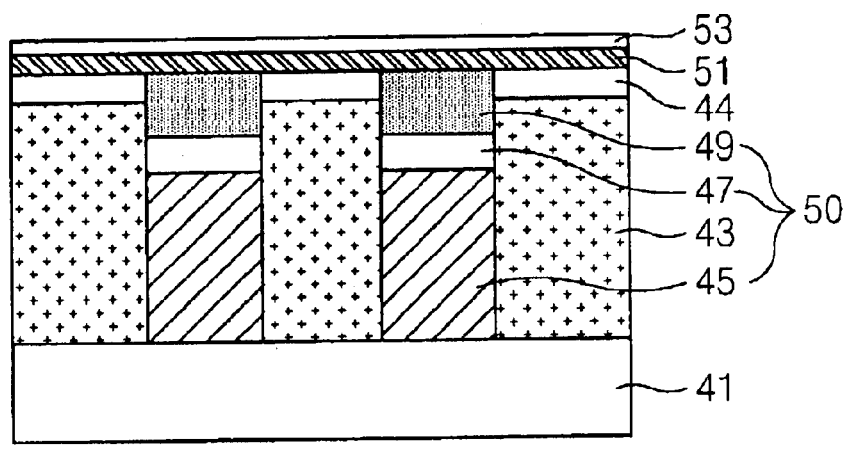
FIGS. 3a through 3e are cross-sectional diagrams illustrating method for manufacturing a semiconductor device in accordance with the disclosed methods.

Referring to FIG. 3a, an interlayer insulating film 43 and a nitride film 44 are sequentially formed on a semiconductor substrate 41, and then etched according to a photo-etching process using a lower electrode contact mask to form a storage electrode contact hole (not shown) for exposing a predetermined portion of the semiconductor substrate 41 for vertical interconnection of a capacitor.

It is preferable that the interlayer insulating film 43 is a $SiO_2$ film and the nitride film 44 is SiON film, each having a thickness ranging from about 300 to about 1000 Å.

Thereafter, polysilicon layer 45 is formed according to the CVD process at a thickness ranging from about 500 to about 3000 Å to fill the storage electrode contact hole and overetched to partially remove the top portion of the contact hole.

Thereafter, a Ti layer (not shown) is formed over the resultant structure, and a RTP is performed to form a $TiSi_2$ layer 47.

The residual Ti layer is removed from the top portion of the interlayer insulating film 43, and a diffusion barrier film 49 is formed over the resultant structure and planarized to form a contact plug 50 having a stacked structure.

The diffusion barrier film 49 may be ternary material such as TiSiN layer, TiAlN layer, TaSiN layer, TaAlN layer or combinations thereof formed using physical vapor deposition (PVD) process or CVD process, and is preferably TiN layer.

A seed conductive layer 51 is formed over the resultant structure, which is used as a seed for a lower electrode formation process.

The seed conductive layer 51 may be Ru layer, Ir layer, Os layer, W layer, Mo layer, Co layer, Ni layer, Au layer, Ag layer or combinations thereof, and preferably Pt layer having a thickness ranging from about 50 to about 1000 Å.

An adhesive layer 53 which is a first insulating layer is formed on the seed conductive layer 51. Preferably, the adhesive layer 53 is an $Al_2O_3$ layer having a thickness ranging from about 50 to about 500 Å.

Figure 3B:
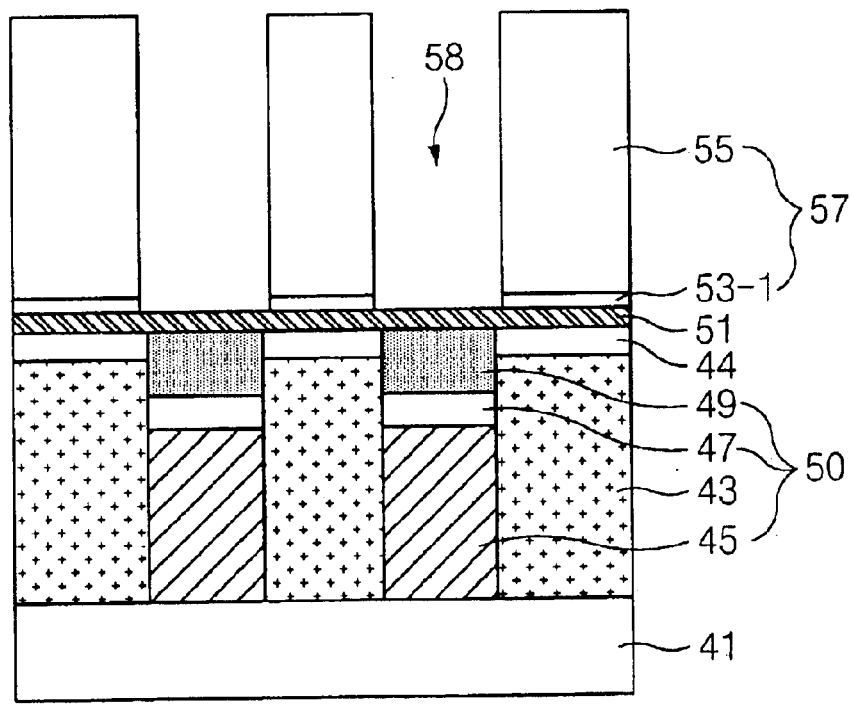

Referring to FIG. 3b, a dummy oxide layer (not shown) which is a second insulating layer is formed on the adhesive layer 53 having a thickness ranging from about 3000 to about 1000 Å using the CVD process.

Here, the dummy oxide layer may be a phosphor silicate glass (PSG) oxide film or undoped silicate glass (USG) oxide film, and may be a photoresist film instead of the oxide films.

A predetermined portion of the dummy oxide layer is removed using a photomask process and a dry etching process to expose the adhesive layer 53, and the exposed portion of the adhesive layer is then removed using the diluted HF solution to expose the seed conductive layer 51, thereby forming a sacrificial film pattern 57a having an opening 58, which is a stacked structure of an adhesive layer pattern 53-1 and a dummy oxide layer pattern 55.

Figure 3C:
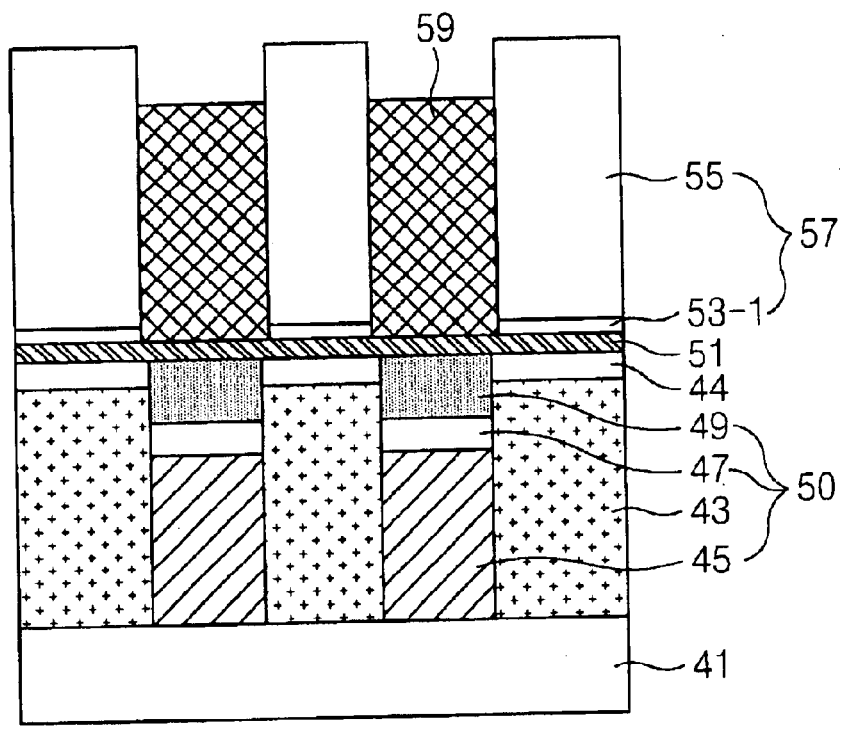

Referring to FIG. 3c, a lower electrode 59 filling the opening 58 is formed using the ECD process with a conductive layer.

Preferably, the conductive layer is Pt layer, the ECD process is a pulse or inverse pulse process using DC power, and a current density ranges from about 0.1 to about 10 $mA/cm^2$.

Figure 3D:
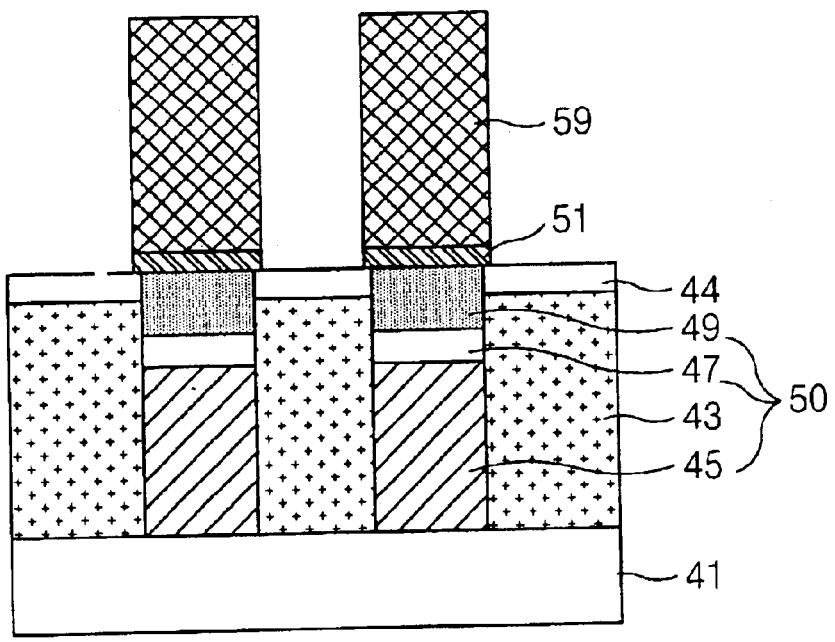

Referring to FIG. 3d, the dummy oxide layer pattern 55 and the adhesive layer pattern 53-1 are sequentially removed using the lower electrode 59 as a mask, and then the exposed portion seed conductive layer 51 is completely removed using a dry etching process.

Figure 3E:
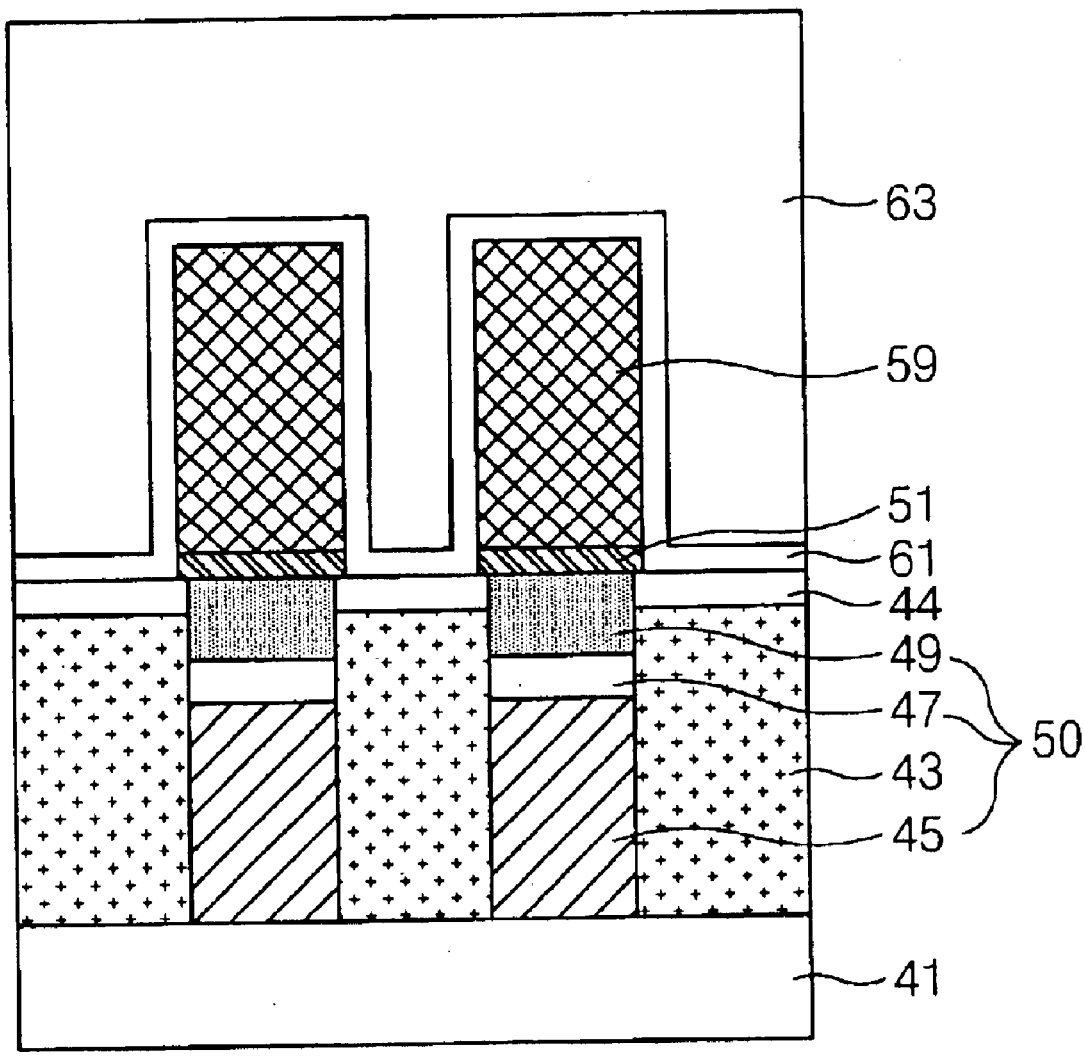

Referring to FIG. 3e, a dielectric film 61 is formed over the entire structure including the lower electrode 59 using CVD process, and then RTP is performed.

Preferably, the dielectric film 61 may be BST ((BaSr)$TiO_3$) layer, PZT (PbZrTiO$_3$) layer, SBT (SrBi$_2$Ta$_2$O$_9$) layer, BLT (Bi$_{(4-x)}$La$_x$Ti$_3$O$_{12}$) layer, or combinations thereof having a thickness ranging from about 150 to about 500 Å, and the CVD process is performed at a temperature ranging from about 400 to about 600° C.

A dielectric film is crystallized by the RTP to obtain desired dielectric property, and is preferably performed at a temperature ranging from about 500 to about 700° C. for a time period of about 30 to about 180 seconds in a nitrogen atmosphere.

Thereafter, an upper electrode 63, preferably a Pt layer, is formed on the dielectric film using the CVD process.

Figure 4:
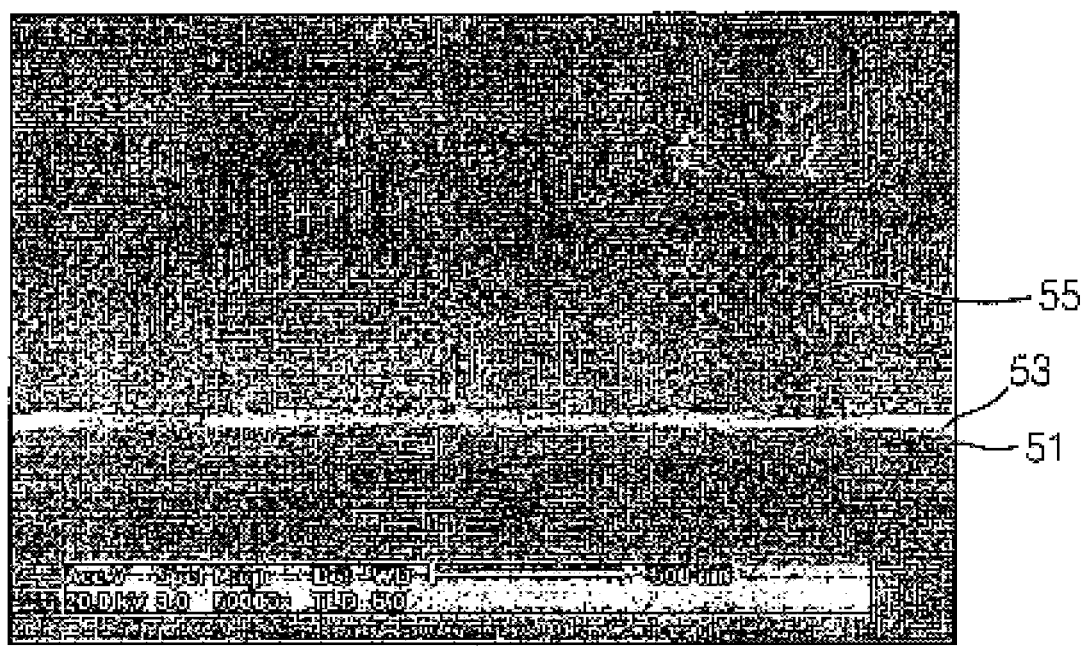
FIG. 4 is a photograph showing a seed conductive layer after a pattering process of a sacrificial film in accordance with the disclosed methods.

When the dummy oxide layer is etched and patterned for the lower electrode, the adhesive layer 53 serves as an etch barrier film preventing the seed conductive layer 51 from being damaged. As a result, the subsequent lower electrode formation process using ECD process can be stably performed (see FIG. 4).

As discussed earlier, in accordance with the present invention, the $Al_2O_3$ layer which is the adhesive layer formed on the seed Pt layer serves as an etch barrier film to protect the seed Pt layer during the sacrificial film pattern formation process for the lower electrode. Therefore, the formation process of the Pt lower electrode using the ECD process can be stably performed, and thus the dielectric film capacitor with superior characteristics can be obtained in a semiconductor device below 0.10 μm in size. As a result, the yield and reliability of the semiconductor devices are improved.

What is claimed is:

1. A method for manufacturing a semiconductor device, comprising the steps of:

forming an interlayer insulating film having a contact hole on a semiconductor substrate;

forming a contact plug by filling the contact hole;

forming a seed conductive layer covering the contact plug and interlayer insulating film;

forming an adhesive layer on top the seed conductive layer without previously etching or removing portions of the seed conductive layer;

wherein the adhesive layer comprises an $Al_2O_3$;

forming a dummy oxide layer on the adhesive layer;

sequentially etching the dummy oxide layer and the adhesive layer to a sacrificial film pattern having an opening which exposes a portion of the seed conductive layer on the contact plug;

forming a lower electrode filling the opening using electrochemical deposition process;

sequentially removing the sacrificial film pattern and the seed conductive layer using the lower electrode as a mask; and sequentially forming a dielectric film and an upper electrode on the entire lower electrode.

2. The method according to claim 1, wherein the adhesive layer comprises an $Al_2O_3$ layer having a thickness ranging from 50 to 500 Å.

3. The method according to claim 1 wherein the step of forming the adhesive layer is selected from the group consisting of a chemical vapor deposition process, a reactive sputtering process and an atomic layer deposition process.

4. The method according to claim 1, wherein an etching selectivity ratio of the adhesive layer to the dummy oxide layer is 50:1.

5. The method according to claim 4, wherein the step of etching the adhesive layer is performed in a solution having a HF to water ratio ranging from 1:1 to 1:1000 (wt %).

6. The method according to claim 5, wherein the step of etching the adhesive layer is performed in a solution having a HF to water ratio ranging from 1:1 to 1:500 (wt %).

7. The method according to claim 1, wherein the step of etching the adhesive layer is performed in a solution having a HF to $NH_4F$ ratio ranging from 1:7 to 1:500 (wt %).

8. The method according to claim 7, wherein the step of etching the adhesive layer is performed in a solution having a HIP to $NH_4F$ ratio ranging from 1:7 to a1:200 (wt %).

9. The method according to claim 1, wherein the seed conductive layer is selected from the group consisting of a Pt layer, Ru layer, k layer, Os layer, W layer, Mo layer, Co layer, Ni layer, Au layer, Ag layer, and combinations thereof.

10. The method according to claim 1, wherein the seed conductive layer has a thickness ranging from 50 to 1000 Å.

11. The method according to claim 1, wherein the dummy oxide layer is selected from the group consisting of a phosphor silicate glass oxide film, an undoped silicate glass oxide film and a photoresist film.

12. The method according to claim 1, wherein the dummy oxide layer has a thickness ranging from 3000 to 10000 Å.

13. The method according to claim 1, wherein the lower electrode comprises a Pt layer.

14. The method according to claim 1, wherein the electrochemical deposition process is a pulse or inverse pulse process using DC power.

15. The method according to claim 1, wherein a current density of the electrochemical deposition process ranges from 0.1 to 10 $mA/cm^2$.

16. The method according to claim 1, wherein the dielectric film is selected from the group consisting of BST ($(BaSr)TiO_3$) layer, PZT ($PbZrTiO_3$) layer, SBT ($SrBi_2Ta_2O_9$) layer, BLT ($Bi_{(4-x)}La_xTi_3O_{12}$) layer, and combinations thereof.

17. The method according to claim 1, wherein the step of forming the dielectric film is a chemical vapor deposition process performed at a temperature ranging from 400 to 600° C.

18. The method according to claim 1, wherein the dielectric film has a thickness ranging from 150 to 500 Å.

19. The method according to claim 1, wherein the upper electrode comprises a Pt layer formed by chemical vapor deposition process.

* * * * *

UNITED STATES PATENT AND TRADEMARK OFFICE
CERTIFICATE OF CORRECTION

PATENT NO. : 6,756,260 B2
DATED : June 29, 2004
INVENTOR(S) : Jong-Min Lee

It is certified that error appears in the above-identified patent and that said Letters Patent is hereby corrected as shown below:

Title page, Item [54] and Column 1, line 1,
Title, please delete "METHOD FOR" and replace with -- METHOD OF --.

Column 5,
Line 5, please delete ";" and insert -- , wherein the adhesive layer comprises an $Al_2O_3$; --.

Column 6,
Line 3, please delete "HIP" and replace with -- HF --.
Line 6, please delete "k layer," and replace with -- lr layer; --.

Signed and Sealed this

Thirtieth Day of November, 2004

JON W. DUDAS
*Director of the United States Patent and Trademark Office*